United States Patent
Prakash

(10) Patent No.: US 6,405,227 B1
(45) Date of Patent: Jun. 11, 2002

(54) DIGITAL CROSSOVER AND PARAMETRIC EQUALIZER

(75) Inventor: S. R. Prakash, San Jose, CA (US)

(73) Assignee: New Japan Radio Co., Ltd., Kamifukuoka (JP)

( * ) Notice: Subject to any disclaimer, the term of this patent is extended or adjusted under 35 U.S.C. 154(b) by 0 days.

(21) Appl. No.: 09/224,008

(22) Filed: Dec. 31, 1998

(51) Int. Cl.⁷ ............................................... G06F 17/10
(52) U.S. Cl. ...................................... 708/300; 708/303
(58) Field of Search ................................ 708/300, 301, 708/303, 313, 316, 319, 320, 322, 323

(56) References Cited

U.S. PATENT DOCUMENTS

| | | |
|---|---|---|
| 4,422,156 A | 12/1983 | Sano |
| 4,661,982 A | 4/1987 | Kitazato et al. |
| 4,709,343 A | 11/1987 | Van Cang |
| 4,845,758 A | 7/1989 | Op de Beek et al. |
| 4,939,684 A * | 7/1990 | Gehrig et al. ............... 708/303 |
| 5,051,981 A | 9/1991 | Kline |
| 5,140,541 A | 8/1992 | Sakata et al. |
| 5,195,141 A | 3/1993 | Jang |
| 5,255,215 A | 10/1993 | Sakata et al. |
| 5,325,318 A | 6/1994 | Harris et al. |
| 5,546,431 A | 8/1996 | Bazes |
| 5,737,254 A | 4/1998 | Lane et al. |

OTHER PUBLICATIONS

Regalia et al., "Tunable Digital Frequency Response Equalization Filters," IEEE Transactions on Acoustics, Speech, and Signal Processing, vol. ASSP–35, Jan. 1987, pp. 118–120.

* cited by examiner

*Primary Examiner*—Chuong Dinh Ngo
(74) *Attorney, Agent, or Firm*—Carr & Ferrell LLP

(57) ABSTRACT

A DSP-based and multi-channel digital filter chip providing crossover filtering and parametric equalization. Crossovers can be low-pass, high-pass, or band-pass filters with programmable cutoff frequencies. Each equalizer band has independently adjustable center frequency band, and levels over a –60 dB to +16 dB range. The chip can work either with a microprocessor controlling the chip or in a stand-alone mode having the filter settings downloaded automatically from an external EEPROM. The chip is ideal for applications that require precise digital filtering or software programmable filters, and is also an alternative to analog filters, eliminating passive components and reducing circuit size.

7 Claims, 12 Drawing Sheets

DIGITAL CROSSOVER AND PARAMETRIC EQUALIZER

BACKGROUND OF THE INVENTION

1. Field of the Invention

This invention relates generally to digital filters and more particularly to providing programmable frequency crossover filters and programmable parametric equalizer filters.

2. Discussion of Background Art

A speaker system usually includes several speakers which each handles a different range of frequencies, such as bass, mid-range, and high frequencies. The boundaries of frequency response for each speaker define crossover points beyond which crossover filters (or crossovers) block out-of-bound signals. Commercially available sub-woofers, for example, usually allow a user to change crossovers.

A frequency response equalizer permits a user to adjust an amplitude gain at a specified frequency without affecting other frequencies. Equalizers are typically implemented as a series or cascade of individual filters, each with an independently adjustable gain to give the overall system the desired frequency response. Equalizers may be classified as graphic or parametric. Graphic equalizers are banks of filters in which only the gain or attenuation of each filter may be adjusted, while the frequency response of an individual filter may not be adjusted. Parametric equalizers are banks of filters in which the center frequency, bandwidth or Q, and the expected gain or attenuation at the center frequency may all be adjusted.

Audio signal crossover filtering and equalization are generally done as separate functions in the analog or digital domain. Analog filter crossover points are tuned by adjusting the filter component (inductors, resistors, etc.) values, which changes the positions of the poles of the filter. Similarly, analog implementations of parametric equalizers allow adjustments of multiple components until the desired response is achieved. Passive analog components increase circuit sizes, may vary or "drift" over time, and thus cause system instability.

Digital filter crossover points are tuned by re-computing the filter coefficients, typically using software running on a general-purpose computer like a personal computer (PC), and then providing the recomputed coefficients to the program which implements the filter. The filter program may be running on the same computer that calculates the coefficients or may be running on a separate digital signal processor (DSP). The software which computes the coefficients typically designs an analog filter, then performs a bilinear transformation, and then performs a frequency domain transformation using an algorithm as described in signal processing texts such as Proakis & Manolakis, "Digital Signal Processing Principles, Algorithms, and Applications," 3$^{rd}$ edition, 1996, Prentice-Hall, sections 8.3.3 and 8.4.2, pp 677–699. For example, a second order Butterworth high-pass filter with a −3 dB cut-off frequency of 1 kHz can be designed through the following steps:

1. Designing an analog 2$^{nd}$ order low-pass Butterworth filter with a cutoff frequency of 1 rad/sec, which has a transfer function of $$H(s) = \frac{1}{\left(s - e^{j\frac{3\pi}{4}}\right)\left(s - e^{j\frac{5\pi}{4}}\right)}$$

2. Transforming the analog filter to a digital filter with a sampling frequency $f_s$ by substituting $$s = 2f_s\left(\frac{1-z^{-1}}{1+z^{-1}}\right)$$

which yields a transfer function H(z) of a filter that has a cut-off frequency of $1/2\pi$ Hz.

3. Evaluating the parameter a for the frequency domain as $$a = \frac{\sin\left(\frac{1-2\pi f_c}{2}\right)}{\sin\left(\frac{1+2\pi f_c}{2}\right)}$$

where $f_c$ is the cutoff frequency of 1000Hz.

This is used to transform the variable z in the transfer function as $$z^{-1} \rightarrow \frac{z^{-1}-a}{1-az^{-1}}$$

After the substitution in H(z), the numerator and denominator of H(z) are simplified to the form $$H(z) = \frac{b_0 + b_1 z^{-1} + b_2 z^{-2}}{1 + a_1 z^{+1} a_2 z^{-2}}$$

The terms b0, b1, b2, a1, and a2 are the coefficients of the desired digital filter.

In digital equalizers, the filter coefficients are computed off-line and loaded into the device or program performing the actual digital filter. The equalizer coefficient computation routine typically follows the approach described in P. A. Regalia & S. K. Mitra, "Tunable Digital Frequency Response Equalization Filters," IEEE Trans. ASSP, vol. 35, no.1, pp. 118–120, January 1997. Once again, the basis for the design is an analog filter, which is transformed using a bilinear transformation. The filter structure is as shown in FIG. 1, which yields a transfer function $$F(z)=½[1+A(z)]+½K[1-A(z)],$$

where $$A(z) = \frac{z^{-2} + b(1+a)z^{-1} + a}{1 + b(1+a)z^{-1} + az^{-2}}$$

and parameters a and b are related to the desired center frequency and bandwidth specifications of the filter.

FIG. 2A shows the frequency response obtained for different values of K, illustrating variable gains at a specified normalized center frequency. FIG. 2B illustrates the effect of varying b while K and a are held constant. FIG. 2C shows how a peak bandwidth may be varied by adjusting only a.

Traditionally, designers use parameters (cutoff frequency, bandwidth, etc.) of the desired frequency response to calculate the filter coefficients (K, a, b, etc.) for the crossovers and/or parametric equalizers. However, this approach requires complicated mathematical calculations, and each time a new set of coefficient values is desired, the user must start with new parameters to recalculate the desired coefficients. A PC needs to be high-powered to calculate the filter coefficients for downloading to a chip. Further, digital implementations of filters typically require users to know DSP programming or to perform complicated filter algorithms.

What is needed, therefore, is a digital filter that can overcome the above-discussed deficiencies.

SUMMARY OF THE INVENTION

The present invention provides a digital signal processing (DSP)-based, multi-channel, digital filter semiconductor chip that performs crossover filtering and parametric equalization. On individual channels crossover filters support programmable cutoff frequencies, and equalizer bands each have an independently adjustable center frequency. The chip can work either in a stand-alone mode receiving filter settings from an external EEPROM, or under control of a microprocessor. Firmware for calculating filter coefficients. is embedded in a ROM and thus enables re-designing filters without resort to external processing intelligence. In the preferred embodiment the chip stores a low-pass prototype filter from which it derives desired filters including low-pass, high-pass, and band-pass filters. The prototype filter coefficients are expressed in poles and zeros to save memory space and to simplify calculations of coefficients. The chip also uses a double precision structure including error correction circuitry to preserve details of coefficient values.

BRIEF DESCRIPTION OF THE DRAWINGS

FIG. 2C shows peak bandwidths for various values of coefficient a;

DETAILED DESCRIPTION OF THE PREFERRED EMBODIMENT

Figure 1:
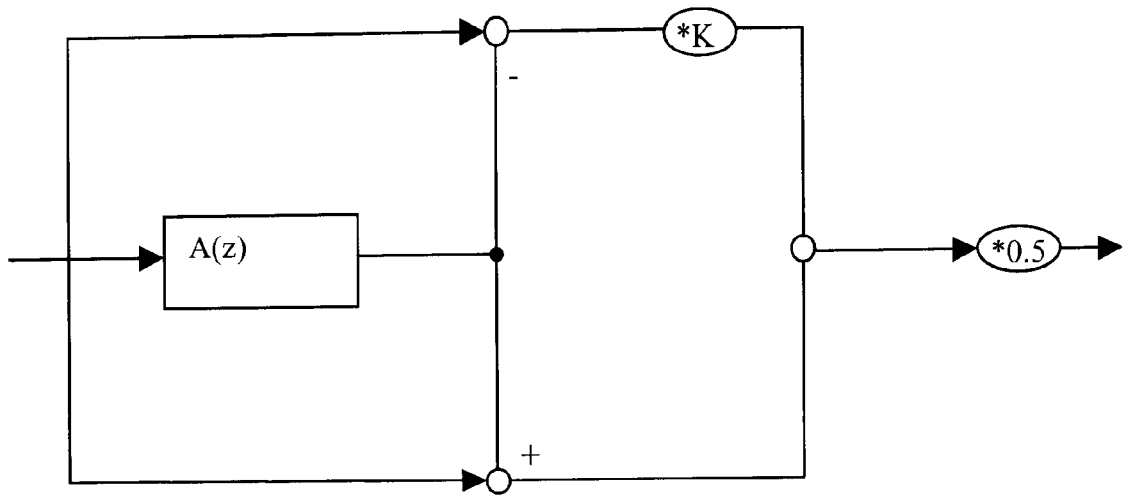
FIG. 1 shows an equalizer filter structure.
Figure 2A:
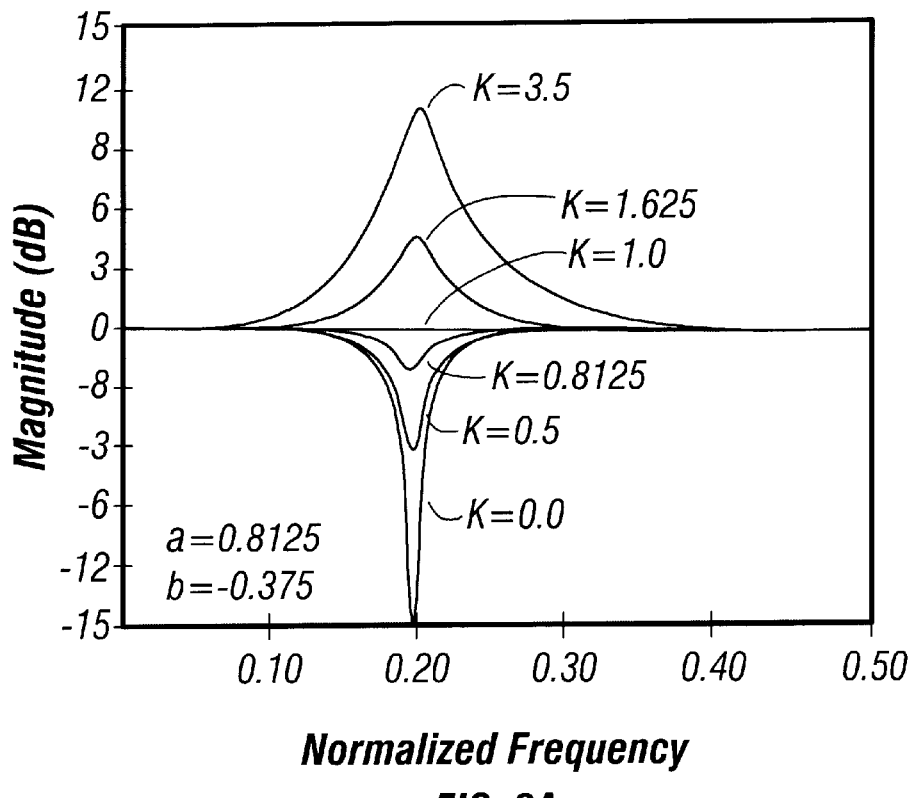
FIG. 2A illustrates gains for different values of coefficient K at a constant frequency.
Figure 2B:
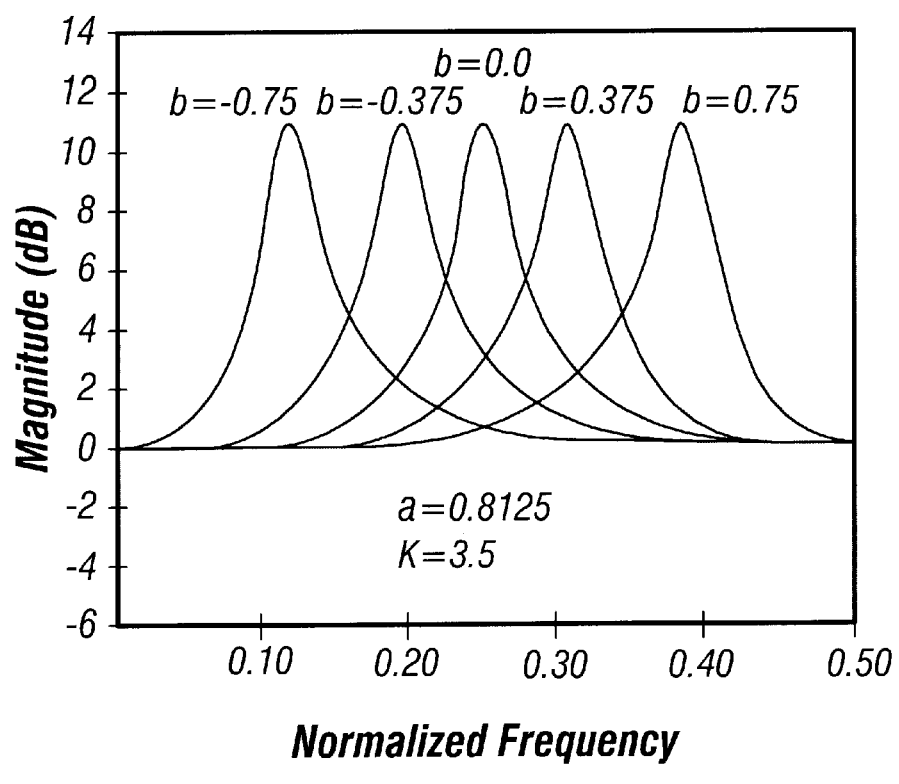
FIG. 2B illustrates the effect of varying coefficient b while holding coefficients a and K constant.
Figure 2C:
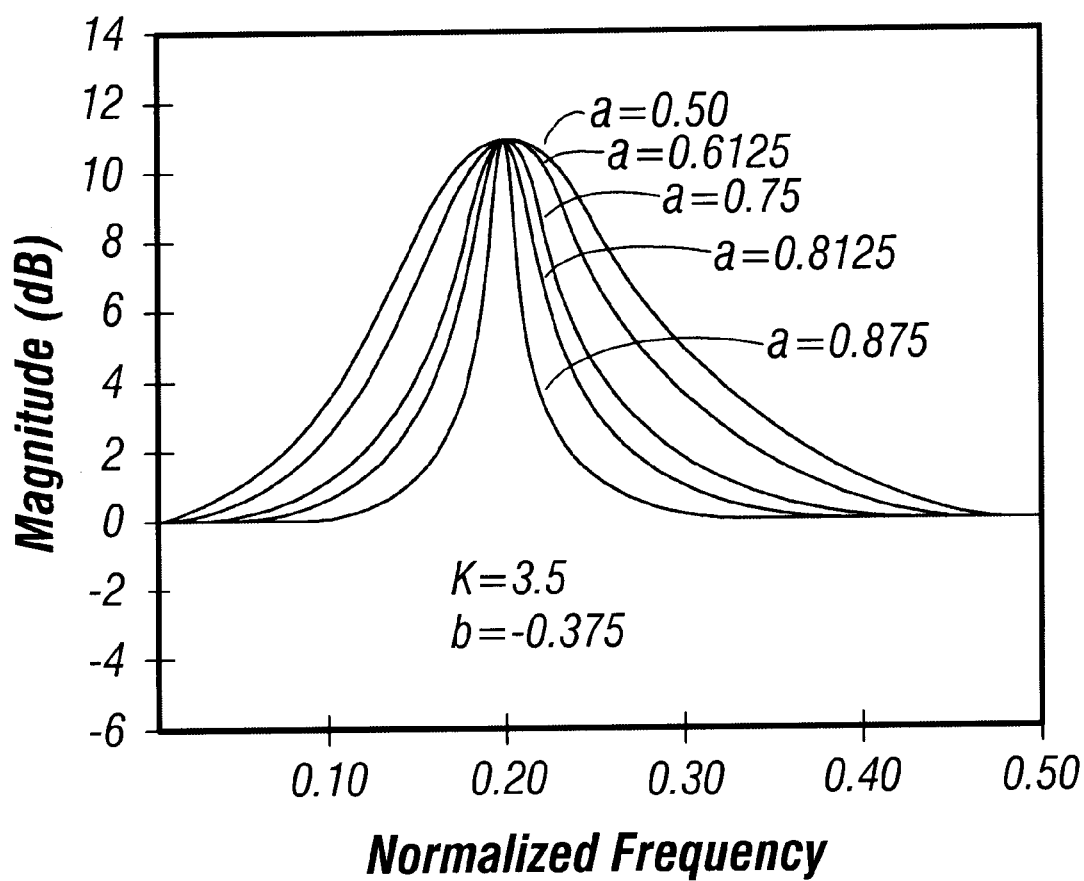
Figure 3:
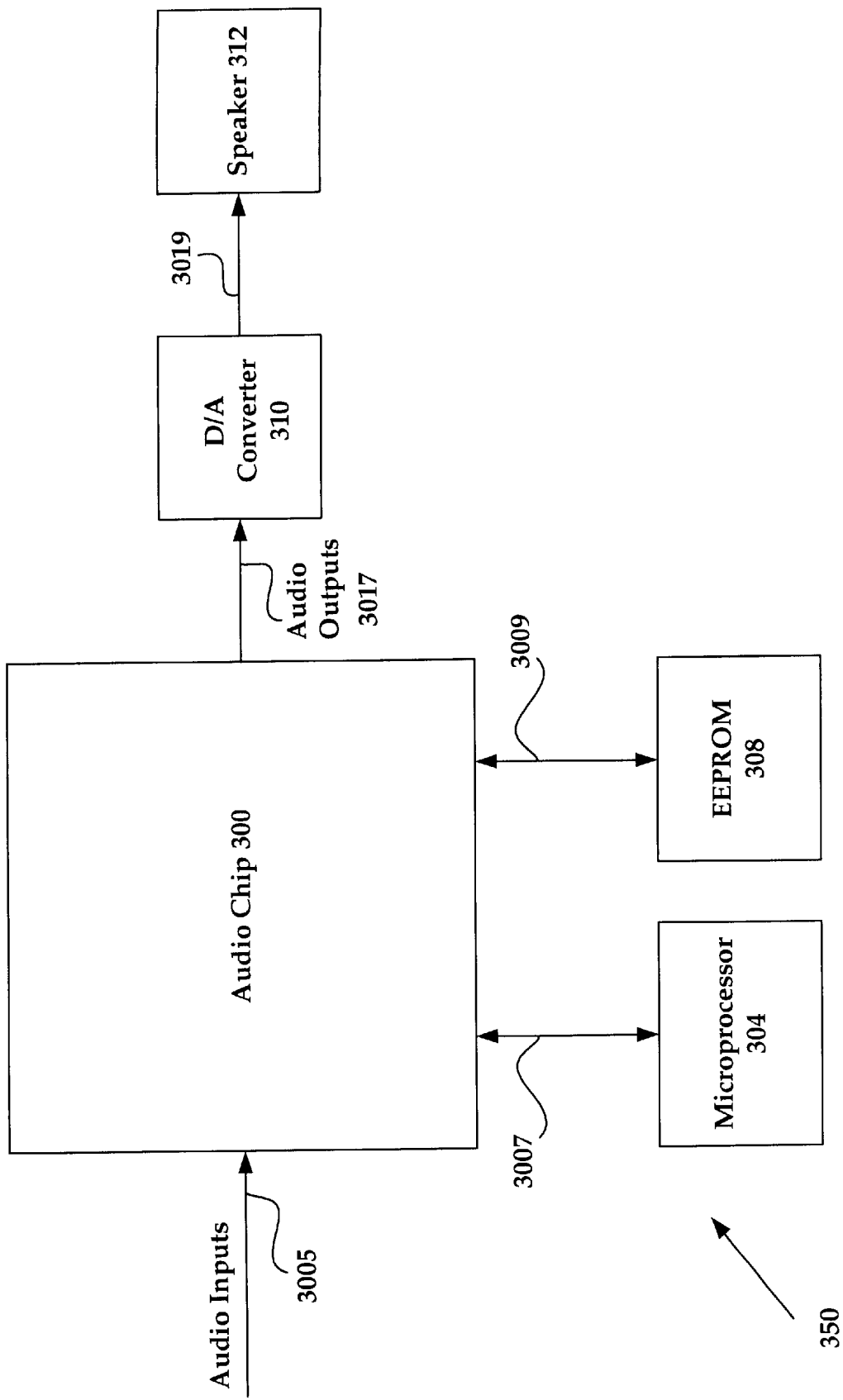
FIG. 3 is an overview of a system utilizing the invention.

FIG. 3 shows the invention embodied in an integrated circuit chip 300 which interfaces with a microprocessor 304, an EEPROM 308, a digital-to-analog (D/A) converter 310, and a speaker 312 in a system 350. Chip 300 preferably receives digital audio input signals on line 3005, and provides digital audio output signals on line 3017. Audio input signals on line 3005 may be received from a compact disc (CD) player, an analog-to-digital (A/D) converter, or other source of digital audio. In the preferred embodiment, chip 300 supports multiple audio data formats, including left justified, right justified, and I$^2$S. Digital audio output signals on line 3017 are converted by D/A converter 310 to analog signals which may drive one or more speakers 312. Alternatively, output signals on line 3017 may be sent to any other device, such as an S/PDIF transmitter, capable of receiving a digital audio stream in one of the preferably supported formats. Analog output signals on line 3019 may be input to an amplifier and/or to other audio conditioning devices before being input to speaker(s) 312. In the preferred embodiment, chip 300 receives two input signals on line 3005 and provides two output signals on line 3017 for a left speaker and a right speaker.

Chip 300 is a multichannel digital filter based on an embedded DSP (FIG. 4) that, in one embodiment, provides up to 24 dB/octave crossover filtering on a stereo digital audio input signal and provides five bands of parametric equalization for each channel. The crossover filters have programmable cutoff frequencies and can be low-pass, high-pass, or band-pass filters. Each equalizer band has an independently adjustable center frequency and bandwidth, and a range of preferably −60 dB to +16 dB. Chip 300 can programmably delay audio signals for over 30 ms to synchronize the times of their arrival from speakers 312 at different distances to a listener position. Chip 300 is suited for use in car stereo amplifiers, in-dash head units, amplified speaker systems, and professional audio equipment. Multiple chips 300 can be used either in parallel to provide more channels or in cascade to improve filter performance. A typical chip 300 application is an automotive after-market amplifier with factory default-set filters that can be customized (re-programmed) by a car dealer during installation.

Chip 300 can work either in parallel or in series with numerous types of microprocessors (or microcontrollers) 304, including for example, Motorola® 68000, Zilog® Z80, or Intel® 8031. Microprocessor 304 controls the chip 300 operation by, for example, based on a user's inputs, specifying a cutoff frequency for a crossover or a center frequency, a bandwidth, and a gain for a parametric equalizer.

Alternatively, chip 300 can operate in a stand-alone mode, that is without a microprocessor 304, preferably using an EEPROM 308 which stores all configuration and filter settings that, upon power-up, can be automatically downloaded into chip 300. EEPROM: 308 is preferably one of the 93C86 serial EEPROM series manufactured by Catalyst, Microchip, or National Semiconductor Corp. Those skilled in the art will recognize that any memory, such as a read-only memory (ROM), a programmable read-only memory (PROM), an electrically programmable read-only (EPROM), or an EEPROM equivalence can be substituted for EEPROM 308. After power-up and a reset, chip 300 checks for the presence of an EEPROM 308 with valid data. If chip 300 finds an EEPROM 308, then chip 300 reads the pre-programmed filter settings from the EEPROM. Chip 300 is preferably reset to restore the EEPROM 308 settings. The EEPROM 308 design can include a data multiplexer to switch from chip 300 to a PC parallel or serial port, which programs EEPROM 308. Subsequent commands from a microprocessor 304 may override the EEPROM 308 data.

Chip 300 calculates the filter coefficients in "background," that is, when chip 300 is not actually running the filter program. In general, chip 300 receives input samples and filters the samples to implement a desired crossover and equalizer. When a new crossover or equalizer is desired, chip 300 provides corresponding new filter coefficients, but must not interfere with the audio playback utilizing chip 300. Chip 300 therefore preferably computes these coefficients in the background, using processor cycles that are not needed to implement the filters.

Chip 300 calculates filter coefficients in real time and enables applications that require precise digital filtering or software programmable filters. Chip 300 is advantageous over analog filters because using chip 300 can eliminate, and thereby avoid reliance on, passive components (capacitors, resistors, inductors, etc). Further, chip 300 enables increasing the stability and reducing the size of a circuit. Chip 300 has the advantages over other digital implementations that a chip 300 user does not need to know how to do DSP programming or how to calculate filters. Given only the desired filter characteristics, chip 300 automatically computes coefficients to provide a desired crossover or parametric equalizer.

Figure 4:
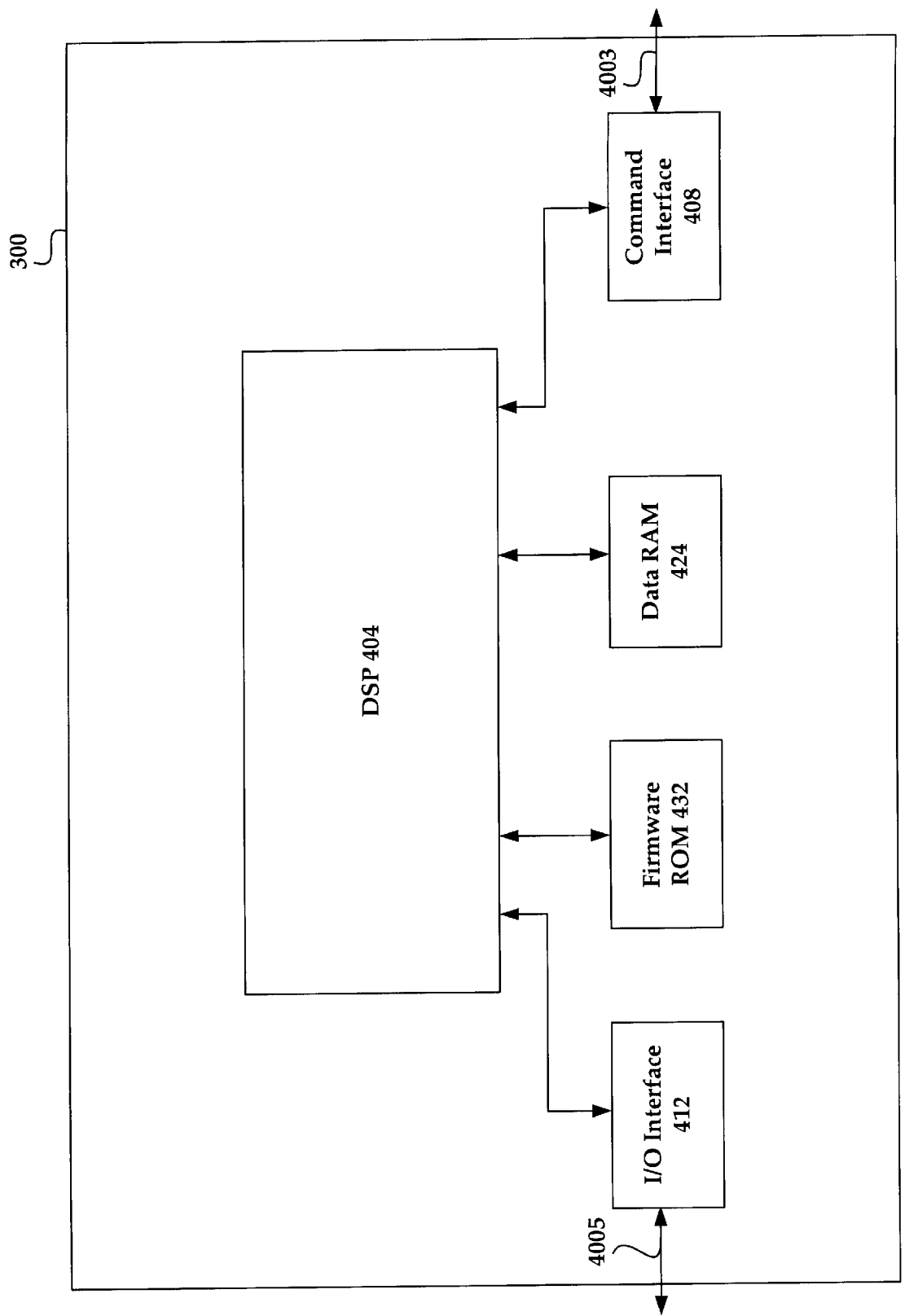
FIG. 4 is a block diagram of the invention in a preferred embodiment as a chip.

FIG. 4 is a block diagram of chip 300 that preferably includes a digital signal processor (DSP) 404, a command interface 408, an I/O interface 412, a data RAM 424, and a firmware ROM 432. Digital signal processor 404 is preferably a 24-bit DSP core, which is the main processing engine of chip 300. The programs implementing the crossover filter, the parametric equalizer, and the filter design algorithms run on DSP 404.

Command interface 408, via line 4003, permits chip 300 to receive operating commands from microprocessor 304 or to receive filter configuration and settings from EEPROM 308.

I/O interface 412 implements various protocols that, via line 4005, exchange audio samples with external devices such as converters or S/PDIF receivers and transmitters. I/O interface 412 also includes a timing generator which provides a system clock for chip 300.

Data RAM 424 is a "memory on chip" which the programs running on DSP 404 use to store data relating to the input audio samples and the processing performed on the samples.

Firmware ROM 432, usually referred to as ROM memory, provides programs and tables used by DSP 404 to design and operate the filters. Chip 300 having ROM 432 firmware capability is advantageous over the prior art because chip 300 is self-contained and can perform filtering without using external processing intelligence.

Figure 5:
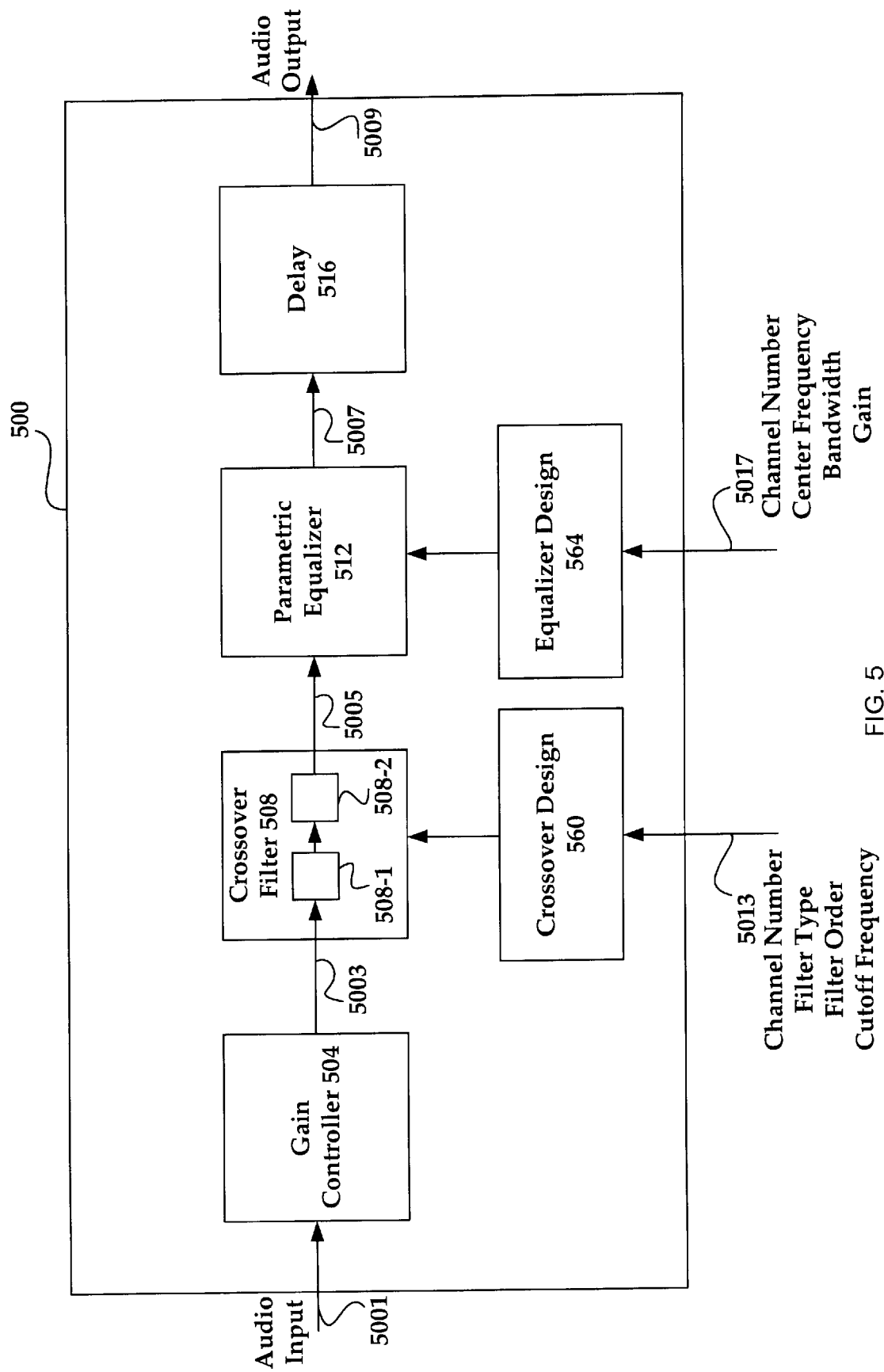
FIG. 5 shows a firmware module using crossover filters and a parametric equalizer according to the invention.

FIG. 5 illustrates the invention in a firmware module 500 run by DSP 404 that includes sub-modules gain controller 504, crossover filter 508, parametric equalizer 512, delay 516, crossover filter design 560, and equalizer design 564, each preferably comprises a firmware program stored in ROM 432. Gain controller 504, via I/O interface 412, receives audio input signals on line 5001, which are typically like those on line 3005 of FIG. 3. Gain controller 504 then amplifies the signals and outputs the amplified signals on line 5003 to crossover filter 508. Crossover filter 508 receives input signals on line 5003, filters the signals, and outputs the filtered signals on line 5005 to parametric equalizer 512. Crossover 508 preferably includes two sections 508-1 and 508-2 in cascade, each section comprises a $2^{nd}$ order filter 513 (not shown). Cascading sections 508-1 and 508-2 permit crossovers of different orders. Parametric equalizer 512 receives input signals on line 5005, equalizes the signals, and outputs the equalized signals on line 5007. Parametric equalizer 512 comprises numerous filtering sections, each of which preferably includes a $2^{nd}$ order filter 513 of the same type as crossover 508. Delay 516 receives input signals on line 5007, delays them by a desired interval, and outputs the delayed signals on line 5009, which are provided via I/O interface 412 as audio output signals on line 3017 (FIG. 3). In the preferred embodiment, DSP 404 runs gain controller 504, crossover filter 508, parametric equalizer 512, and delay 516 to provide desired output signals (on line 5009). If a new crossover filter is requested, crossover design 560, via command interface 408, receives user inputs on line 5013 from microprocessor 304 or EEPROM 308, calculates filter coefficients, and provides the coefficients to each filter section 508-1 and 508-2 to form the desired crossover filter 508. Similarly, if a new equalizer is desired, equalizer design 564, via command interface 408, receives user inputs on line 5017, calculates filter coefficients for a specified band, and provides the coefficients to parametric equalizer 512. DSP 404 runs crossover design 560 or equalizer design 564 preferably in background.

Figure 6A:
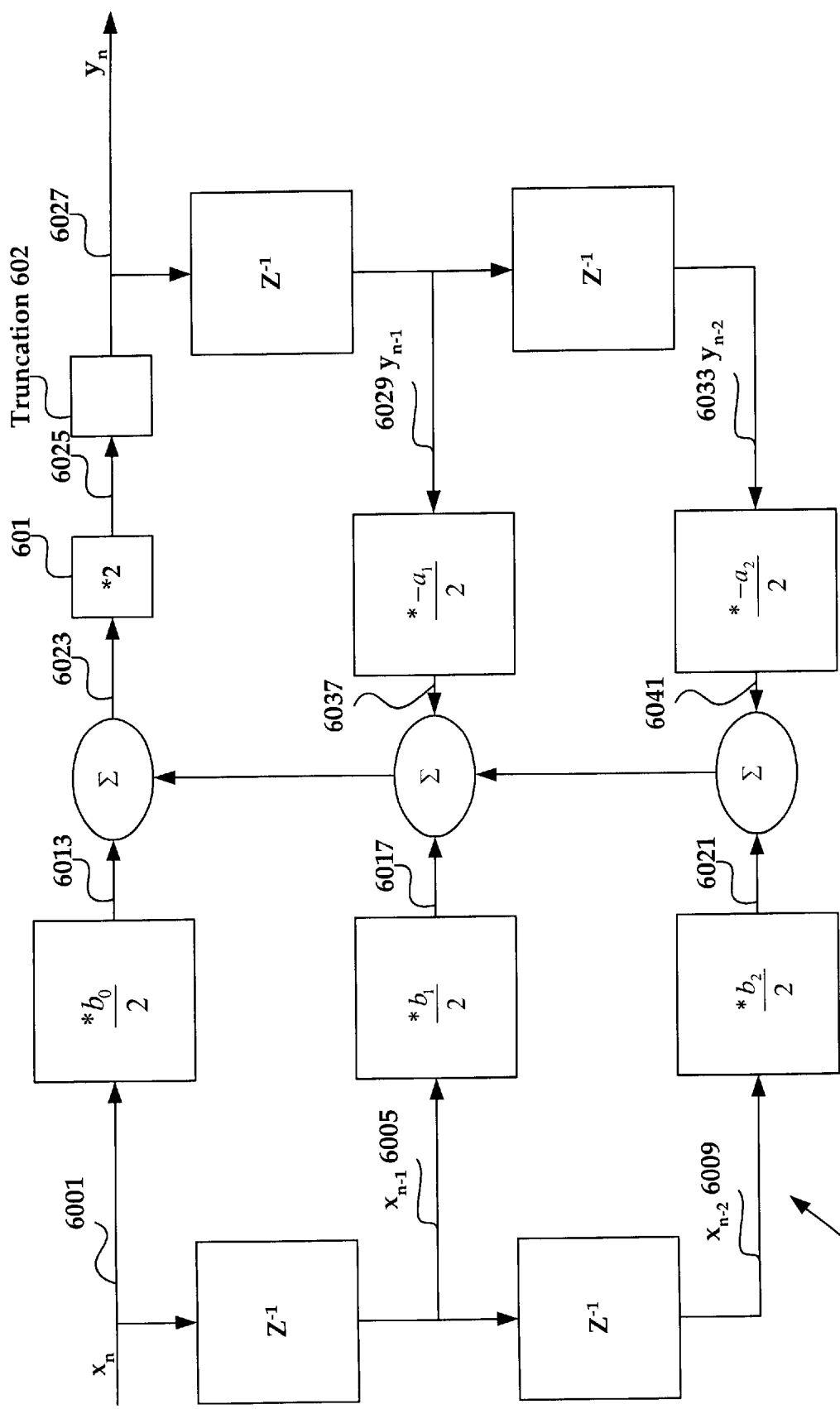
FIG. 6A shows a filter structure according to the invention.

FIG. 6A shows a filter structure 600 utilized by filter 513. As used in FIG. 6A, $x_n$ is the current audio input sample; $y_n$ is the current audio output sample; and $b_0$, $b_1$, $b_2$, $a_1$, and $a_2$ are filter coefficients. Those skilled in the art will recognize that the FIG. 6A filter structure implements the following difference equation:

$$y_n = 2^* \left[ \frac{b_0}{2} x_n + \frac{b_1}{2} x_{n-1} + \frac{b_2}{2} x_{n-2} - \frac{a_1}{2} y_{n-1} - \frac{a_2}{2} y_{n-2} \right] \quad (3)$$

which is equivalent in the frequency domain to:

$$H(z) = \frac{Y(z)}{X(z)} = \frac{b_0 + b_1 z^{-1} + b_2 z^{-2}}{1 + a_1 z^{-1} + a_2 z^{-2}} \quad (4)$$

Filter 513 uses half of the values for each coefficient ($b_0/2$, $b_1/2$, etc.) rather than the full values ($b_0$, $b_1$, etc.) because DSP 404 represents these coefficients in the range $[-1, 1]$. Multiplier 601 compensates for the use of coefficient half values.

To program crossover filters for each channel, crossover design 560 requires inputs on line 5013 for a channel number, a filter type, a filter order, and a cutoff frequency. For example, a left channel, low-pass filter of $2^{nd}$ order with a cutoff frequency of 150 Hz. The cutoff frequency is preferably expressed in terms of half the system sampling frequency ($f_s/2$). Crossover design 560 provides a crossover filter 508 having a maximum pass gain of preferably 0 dB. Crossover design 560 preferably uses cutoff frequency data to detect a filter type. For example, a low-pass filter is formed only if a non-zero low-pass cutoff frequency is specified and the high-pass cutoff frequency is equal to zero. The low-pass cutoff is preferably the upper frequency −3 dB point of the low-pass filter. Similarly, a high-pass filter is formed only if a valid high-pass cutoff frequency is specified and the low-pass cutoff frequency is equal to zero. If both frequency data fields are non-zero, a band-pass filter is assumed with the low-pass data specifying the upper frequency cutoff and the high-pass data specifying the lower frequency cutoff. In such a case, the low-pass frequency must be greater than the high-pass frequency. Further, in the preferred embodiment, a band-pass crossover is implemented as a cascade of a $2^{nd}$ order. low-pass filter and a $2^{nd}$ order high-pass filter.

From the input parameters provided either by microprocessor 304 or by EEPROM 308 crossover design 560 calculates the coefficients $b_0$, $b_1$, $b_2$, $a_1$, and $a_2$, for each section 508-1 and 508-2 selected in crossover 508, and thereby configures a desired crossover filter 508. For each section, crossover design 560 first stores a prototype filter, preferably a Butterworth filter using half the system sampling frequency ($f_s/2$), and applies the specified (low-pass, high-pass, etc.) filter type and cutoff frequency to transform the prototype filter into a desired filter. Because the prototype filter is a Butterworth filter, the designed filter will also be a Butterworth filter. Crossover design 560 transforms the prototype filter into a desired filter (low-pass, high-pass, etc.) by using a function f(z) to replace the independent variable z in transfer function (4). To avoid calculation complexity susceptible to arithmetic round-off errors, crossover design 560 uses poles, zeros, and gain to represent the prototype filter. Poles and zeros are complex numbers in the form of C=r+ji, in which r is the real part and i is the imaginary part of the complex number C. Since poles and zeros are points in the complex plane, they are transformed in the same way as the independent variable z. Zeros are known from the filter type, while poles for a desired filter are easily evaluated. For example, for a low-pass filter and a high-pass filter, zeros are (−1,0) and (+1,0) respectively. Thus, crossover design 560 does not need to store zeros and thereby saves storage space and computing time.

As indicated:

$$H(z) = \frac{b_0 + b_1 z^{-1} + b_2 z^{-2}}{1 + a_1 z^{-1} a_2 z^{-2}}$$

but using poles and zeros:

$$H(z) = \frac{b_0 + b_1 z^{-1} + b_2 z^{-2}}{1 + a_1 z^{-1} + a_2 z^{-2}} = \frac{K(1 - Z_1 z^{-1})(1 - Z_2 z^{-1})}{(1 - P_1 z^{-1})(1 - P_2 z^{-1})}$$

$$= \frac{K - K(Z_1 + Z_2) z^{-1} + K Z_1 Z_2 z^{-2}}{1 - (P_1 + P_2) z^{-1} + P_1 P_2 z^{-2}},$$

wherein $b_0$=K(gain)
$b_1$=−K($Z_1$+$Z_2$)
$b_2$=K$Z_1 Z_2$
$a_1$=$P_1$+$P_2$
$a_2$=$P_1 P_2$ If a subscript p denotes parameters associated with the prototype filter, then crossover design 560 stores K, $P_{1p}$ and $P_{2p}$. However, since both the prototype filter and a desired filter have real coefficients, poles $P_{1p}$ and $P_{2p}$ are complex conjugate numbers. Crossover design 560 thus stores only $K_p$, $P_{r1p}$ and $P_{i1p}$ where $P_{1p}$=$p_{r1p}$+j$p_{i1p}$. For simplicity, the following description uses $P_p$ (instead of $P_{1p}$) to denote a pole of the prototype filter. If a subscript d denotes parameters associated with a desired filter, then crossover design 560 provides a desired low-pass filter and a high-pass filter as described below. A band-pass filter is obtained by designing a $2^{nd}$ order low-pass filter for section 508-1 followed by a $2^{nd}$ order high-pass filter for section 508-2 of crossover 508.

Transformation from a Prototype Low-pass Filter to a Desired Low-pass Filter

Crossover design 560 uses a function f(z) in which $$f(z^{-1}) = \frac{z^{-1} - a}{1 - az^{-1}}$$

or $$f(z) = \frac{1 - az^{-1}}{z^{-1} - a}$$
$$= \frac{z - a}{1 - az}$$

Applying the same transformation to the poles yields $$P_d = \frac{P_p - a}{1 - aP_p}$$

wherein $$a = \frac{\sin[(\omega_p - \omega_d)/2]}{\sin[(\omega_p + \omega_d)/2]}$$

and $\omega_p$=band edge frequency of the prototype filter
$\omega_d$=band edge frequency of the desired filter
Zeros ($Z_{1d}$ and $Z_{2d}$) for the desired low-pass filter remain at (−1,0).

To maintain the peak of the filter response at 1,0, crossover design 560 uses $$K_d = K_p \frac{(1-a)^2}{\|(1+aP_d)\|^2}$$

Transformation from a Prototype Low-pass Filter to a Desired High-pass Filter

Crossover design 560 uses function f(z) wherein $$f(z^{-1}) = -\frac{z^{-1} + a}{1 + az^{-1}}$$

to yield $$P_d = \frac{P_p + a}{1 + aP_p}$$

in which $$a = -\frac{\cos[(\omega_p + \omega_d)/2]}{\cos[(\omega_p - \omega_d)/2]}$$

and $\omega_p$=band edge frequency of the prototype filter
$\omega_d$=band edge frequency of the desired filter
Zeros ($Z_{1d}$ and $Z_{2d}$ for the desired high-pass filter are at (+1,0), and gain $K_d$ is transformed in the same manner as the low-pass case, that is:

$$K_d = K_p \frac{(1-a)^2}{\|(1+aP_d)\|^2}$$

Transformation from a Low-pass Prototype Filter to a Desired Band-pass Filter

Crossover design 560 creates a $2^{nd}$ order low-pass filter cascaded to a $2^{nd}$ order high-pass filter to construct a desired band-pass filter. Crossover design 560 first transforms the low-pass prototype filter to a $2^{nd}$ order low-pass filter having a cutoff frequency equal to the upper band edge of the desired band-pass filter. Crossover design 560 then loads the filter coefficients of the transformed low-pass filter into section 508-1 of crossover 508. Crossover design 560 again transforms the low-pass prototype filter to a $2^{nd}$ order high-pass filter having a cutoff frequency equal to the lower band edge of the desired band-pass filter. Crossover design 560 then loads the filter coefficients of this transformed high-pass filter into section 508-2 of crossover 508. Consequently, a low-pass filter followed by a high-pass filter creates the desired band-pass filter.

In the preferred embodiment, filter 513 uses 24 bits for each input $x_n$ and output $y_n$. Those skilled in the art will recognize that $x_{n-1}$ and $x_{n-2}$ on respective lines 6005 and 6009 are 24 bits, and data on lines 6013, 6017, and 6021, resulting from a multiplication with a filter coefficient ($b_0$, $b_1$, and $b_2$), are 48 bits. Consequently, data on lines 6023 and 6025 are 48 bits. However, because $y_n$ is preferably only 24 bits, truncation 602 receives 48-bit data on line 6025 and truncates it to form 24-bit data $y_n$. Accordingly, data $y_{n-1}$ and $y_{n-2}$ on respective lines 6029 and 6033 are also 24 bits. This introduces quantization noise to $y_n$ on line 6027, which degrades filter performance. Therefore, filter 513 uses a double precision data structure to improve $y_n$ precision and thereby reduce quantization noise. If $d_n$ denotes the difference between 48 bit data on line 6025 ($yf_n$) and the truncated 24 bit data $y_n$ on line 6027

$$d_n = yf_n - y_n$$

and if filter 513 stores the error signal $d_n$ for past values of $y_n$, then equation (3) for $yf_n$ becomes $$yf_n = b_0 x_n + b_1 x_{n-1} + b_2 x_{n-2} - a_1(y_{n-1} + d_{n-1}) - a_2(y_{n-2} + d_{n-2})$$

Thus $yf_n$, as compared to $y_n$, includes the two new terms $-a_1 d_{n-1}$ and $-a_2 d_{n-2}$.

Figure 6B:
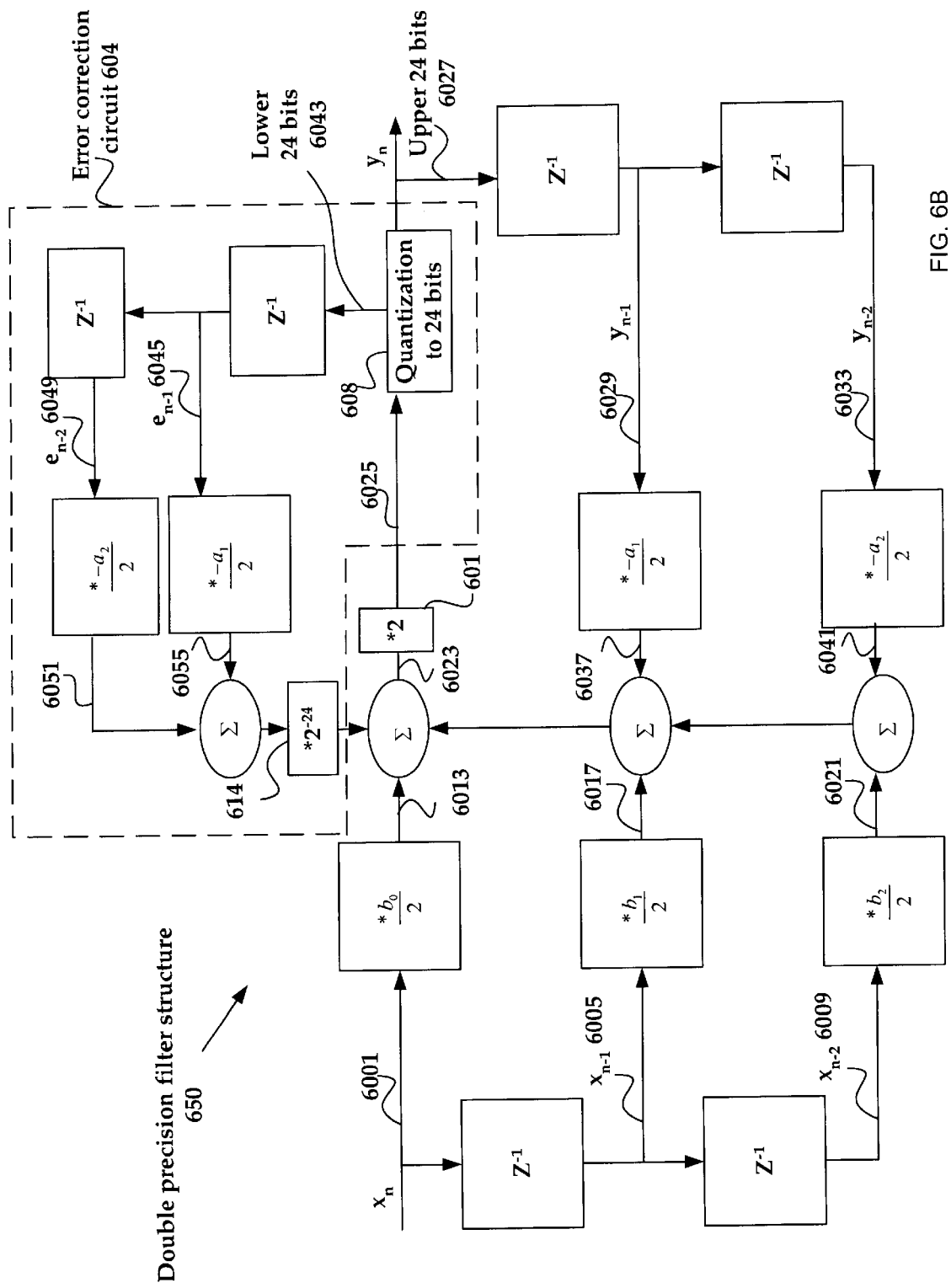
FIG. 6B shows the filter structure of FIG. 6A including an error correction circuit according to the invention.

FIG. 6B shows a double precision filter structure 650 that takes account of the two new terms $-a_1 d_{n-1}$ and $-a_2 d_{n-2}$. Filter structure 650 is the same as FIG. 6A filter structure 600 except that filter structure 650 includes a feedback loop 604 including a quantization 608 and a multiplier 614. Quantization 608 allows $y_n$ to have its upper 24 bits of data on line 6027 and preserves the lower 24 bits of data, which appears on line 6043. Data $e_{n-1}$ and $e_{n-2}$ on respective lines 6045 and 6049 represent scaled data of $d_{n-1}$ and $d_{n-2}$. When the lower 24-bits on line 6043 are multiplied with the coefficients $a_1$ and $a_2$, they are treated as full-scale 24-bit numbers, that is, they are scaled by $2^{24}$. The invention uses $e_{n-1}$ and $e_{n-2}$ to represent scaled values of $d_{n-1}$ and $d_{n-2}$, respectively. Therefore, $$e_n = 2^{24} * d_n$$

Multiplier 614 compensates for the $2^{24}$ scaling factor.
Consequently, filter structure 650 provides the equation:

$$y_n = b_0 x_n + b_1 x_{n-1} + b_2 x_{n-2} - a_1 y_{n-1} - a_2 y_{n-2} + 2^{-24} * (-a_1 e_{n-1} - a_2 e_{n-2})$$

Figure 7A:
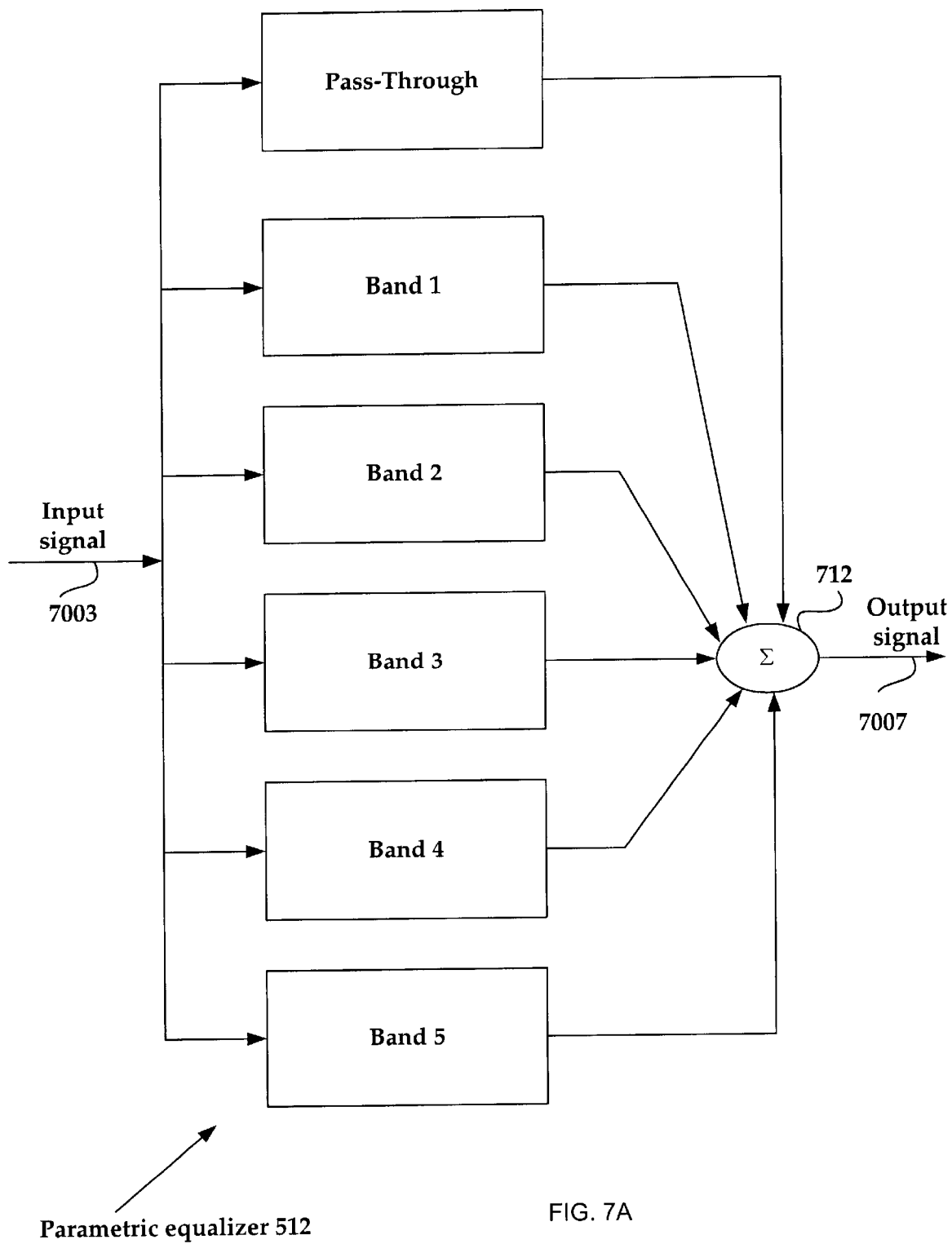
FIG. 7A shows a parametric equalizer according to the invention.

FIG. 7A shows an exemplary parametric equalizer 512, having a pass-through path, five equalizing bands 1 to 5 each including a filter 513, and a summation circuit 712. Those skilled in the art will recognize that the number of equalizing bands may vary. Each equalizing band adjusts the input signal level on line 7003 by a gain that can be greater than 1 depending on the filter gain and on the amount of band overlap. Initially, band 1 through band 5 have zero gain and the audio signal input on line 7003 passes unchanged via the pass-through path. Each band 1 to band 5, via summation circuit 712, adds to the output on line 7007 only if the band is programmed with non-zero gain coefficient. Positive gain (>0 dB) boosts the audio level for a frequency band, while negative gain (<0 dB) lowers the audio level for a frequency band.

Parametric equalizer programming is preferably done with one command for each band for each channel. Any band can be programmed to operate at any center frequency in any order. The bands may overlap or even fall on top of each other with the same center frequency as long as the expected phase response is acceptable. In the preferred embodiment each band can have either a boost or a cut with a gain of from −60 dB to +16 dB. Both the center frequency and the −3 db bandwidth can be programmed independently for each band. The frequency values are preferably specified in the same manner as for the crossover filters.

Figure 7B:
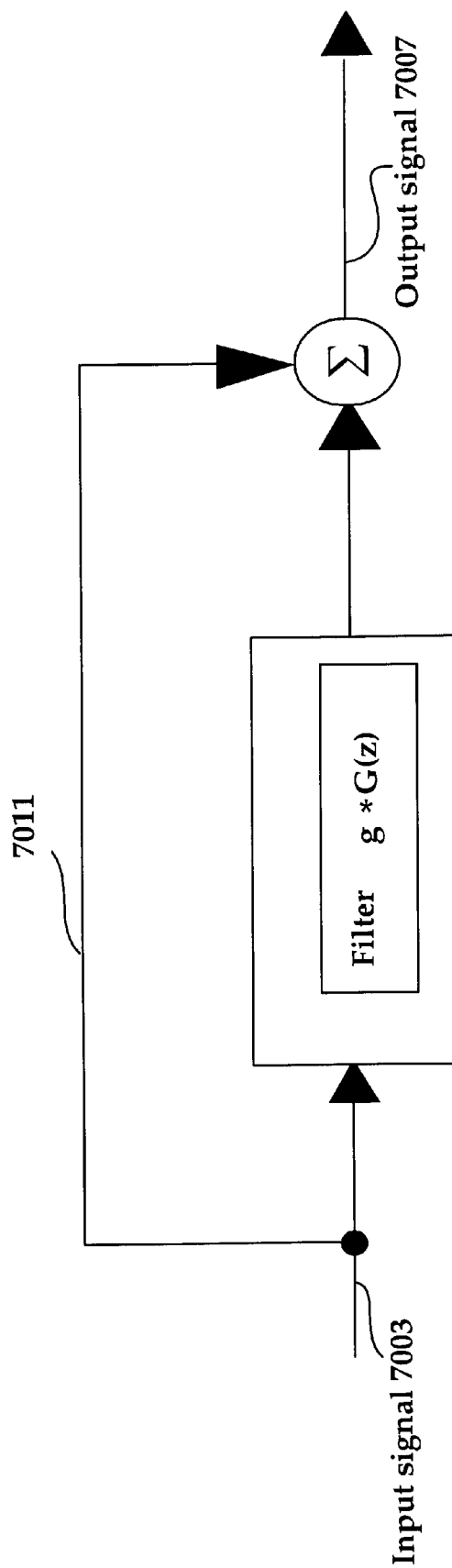
FIG. 7B shows an equalizer filter utilized by the parametric equalizer of FIG. 5.

FIG. 7B shows an equalizer filter design structure in which each filter band is considered as a filter in parallel with a common pass-through signal path. Input and output signals on lines 7003 and 7007 are the same as those of FIG. 7A. A signal on line 7011 is equivalent to a signal passing through the FIG. 7A "pass-through" path. The parameter g represents the gain and G(z) represents a filter for each band 1 to 5 of FIG. 7A. Those skilled in the art will recognize that filter G(z) represents filter 513.

Each band of parametric equalizer 512, using filter G(z), performs a $2^{nd}$ order filter (biquad) processing and scaling by gain g on the input signal received on line 7003. Equalizer design 564 uses a set of parameters including $V_0$, $\Omega_c$, and $W_b$ for each equalizer band to calculate gain g and coefficients $b_0$, $b_1$, $b_2$, $a_1$, and $a_2$ for filter G(z). A user provides these parameters either via microprocessor 304 or EEPROM 308. $V_0$ is the equalizer band gain specified in terms of the output signal amplitude on line 7007 relative to the input signal amplitude on line 7003. $\Omega_c$ is the center frequency expressed preferably in terms of half the system sampling rate ($f_s/2$). $W_b$ is the filter bandwidth expressed also preferably in terms of half the system sampling rate. $W_b$ is normally defined as the frequency spacing between the 3 db points of each equalizer band response.

Equalizer design 564 uses the transfer function:

$$G(z) = \frac{(1+a) - (1+a)z^{-2}}{1 + d(1-a)z^{-1} - az^{-2}} \quad (5)$$

where $$a = \frac{\tan(\omega_b) - 1}{\tan(\omega_b) + 1} \text{ for } V_0 > 1 \text{ and}$$

$$a = \frac{\tan(\omega_b) - V_0}{\tan(\omega_b) + V_0} \text{ for } 0 < V_0 < 1$$

and $$g = \frac{V_0 - 1}{2}$$

Comparing transfer function (4) with transfer function (5)
$b_0 = 1 + a$
$b_1 = 0$
$b_2 = d(1 + a)$
$a_1 = d(1 - a)$
$a_2 = -a$ Thus the invention, via equalizer design 564, requires fewer computations and provides better accuracy over prior art solutions because equalizer design 564 uses fewer addition and multiplication operations. The pass-through path (line 7011) common to other equalizer bands including band 1 to band 5 of FIG. 7A reduces the number of additions.

Equalizer design 564 provides the capability for a user to control characteristics of each frequency band, such as the position of the band with respect to the frequency spectrum, the bandwidth, and the gain of the band. A user can take account of environmental responses to adjust to a desired frequency. Environmental responses include room setup, distances from speakers to listening positions, and resonances that can degrade audio qualities.

The invention, via microprocessor 304 or EEPROM 308, provides commands to directly access the filter coefficients (g, $a_1$, $b_1$, etc.) for either crossover filter 508 or parametric equalizer filter 512. Selecting proper coefficients creates a desired crossover (including a low-pass, a high-pass, or a band-pass) or changes the filter in each band of parametric equalizer 512.

Figure 8:
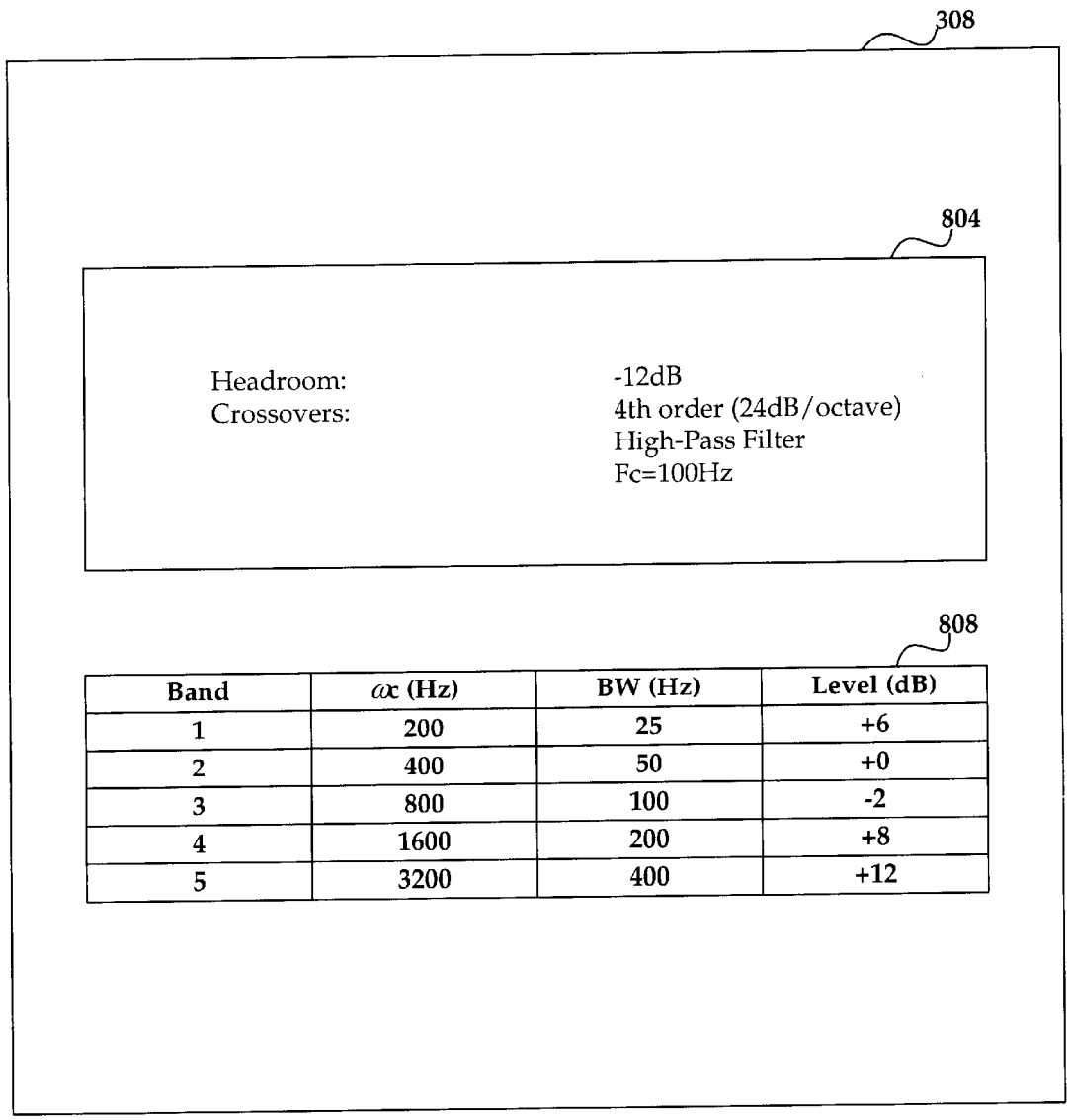
FIG. 8 shows exemplary filter settings of an EEPROM for use with the invention.

FIG. 8 shows an exemplary EEPROM 308 filter settings data file for producing a stereo filter. Block 804 includes parameters for crossover 508 and block 808 includes parameters for parametric equalizer 512. Block 804 shows a headroom of −12 dB, which is a scaling factor applied to crossover filter inputs for reducing the input level by 12 dB. The desired crossover filter is a $4^{th}$ order high-pass filter, and the cutoff frequency is 100 Hz. Block 808 shows the values of the center frequency ($\omega_c$), bandwidth (BW); and attenuation factor (level) for each of band 1 to band 5. A negative value in the level column indicates a cut and a positive value indicates a boost.

EXAMPLE APPLICATION OF THE INVENTION

Figure 9:
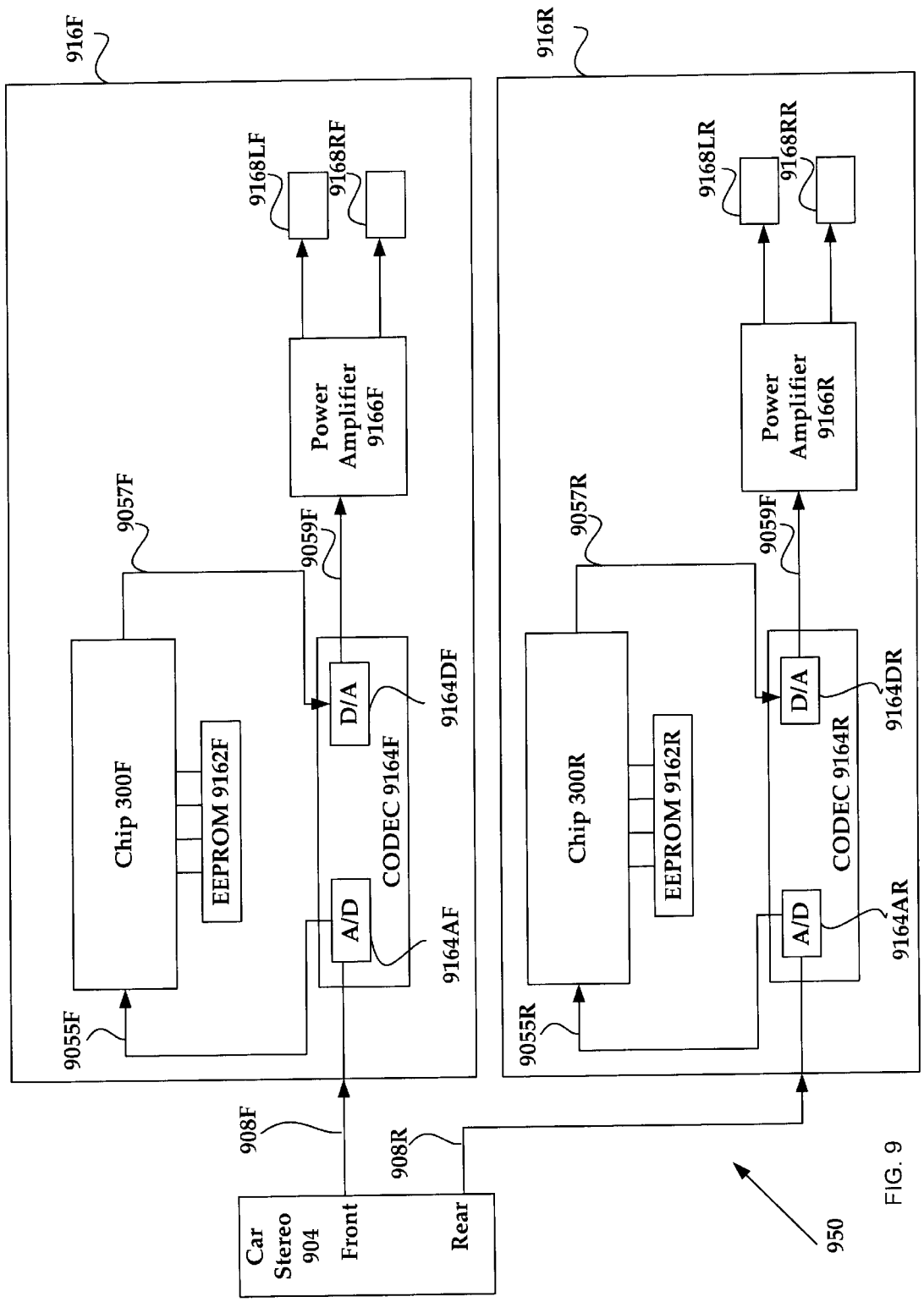
FIG. 9 illustrates a typical application of the invention.

FIG. 9 shows a system 950 illustrating a typical application for chip 300. System 950 includes a car stereo 904, providing audio signals via a front port 908F and a rear port 908R to a front sound system 916F and a rear sound system 916R, respectively. Sound systems 916F and 916R, for illustrative purposes, include a respective chip 300, EEPROM 9162, CODEC 9164, power amplifier 9166, and speakers 9168R and 9168L, all having a suffix F for front sound system 916F and a suffix R for rear sound system 916R, respectively. CODEC 9164 includes an A/D converter 9164A and a D/A converter 9164D. AID converter 9164A, via port 908, receives analog signals from car stereo 904, converts the analog signals to digital signals, and provides the digital signals on line 9055 to chip 300. Chip 300 receives digital signals on line 9055, performs the required filtering, and outputs digital signals on line 9057 to D/A converter 9164D. EEPROM 9162 performs the same function as EEPROM 308 (FIG. 3), that is, it stores the filter configuration and settings for chip 300. D/A converter 9164D receives digital signals on line 9057, converts them to analog signals, and provides the analog signals on line 9059 to power amplifier 9166. Power amplifier 9166 receives analog signals on line 9059, amplifies the signals, and provides them to left and right speakers 9168L and 9168R.

The invention has been explained above with reference to a preferred embodiment. Other embodiments will be apparent to those skilled in the art after reading this disclosure. Therefore, these and other variations upon the preferred embodiment are intended to be covered by the appended claims.

What is claimed is:

1. A device having a multi-channel digital filter, comprising:
    a digital signal processor (DSP) for running said filter;
    an I/O interface coupled to said DSP for exchanging information with external devices;
    a first memory coupled to said DSP for use by said DSP; and
    a second memory coupled to said DSP
        for providing programs which implement filters by providing a desired filter from a prototype filter, and
        for providing filter design processes
    and thereby providing outputs for said filter; wherein coefficients for said prototype filters are represented using a pole.

2. The device of claim 1 wherein said prototype filter is a low-pass filter.

3. The device of claim 1 wherein said filter provides parametric equalization for at least one equalizer band having an independently adjustable center frequency.

4. The device of claim 1 wherein said filter can receive operating instructions provided by a group consisting of a microprocessor and a third memory.

5. The device of claim 4 wherein said third memory stores downloadable filtering settings for said filter.

6. The device of claim 4 wherein said third memory is selected from a group consisting of a ROM, a PROM, an EPROM, and an EEPROM.

7. A memory storing a program implementing filters embedded in a chip comprising:
    means for storing filter coefficients using a pole; and
    means for calculating filter coefficients using poles and zeros; wherein said program provides crossover filtering and parametric equalization.

* * * * *